(12) United States Patent
Pai et al.

(10) Patent No.: US 7,614,341 B1
(45) Date of Patent: Nov. 10, 2009

(54) APPARATUS AND METHOD FOR A SEGMENTED SQUEEGEE FOR STENCILING

(75) Inventors: Deepak K. Pai, Burnsville, MN (US); Scott P. Lichtenauer, Burnsville, MN (US)

(73) Assignee: General Dynamics Advanced Information Systems, Inc., Fairfax, VA (US)

( * ) Notice: Subject to any disclaimer, the term of this patent is extended or adjusted under 35 U.S.C. 154(b) by 0 days.

(21) Appl. No.: 11/076,422

(22) Filed: Mar. 10, 2005

Related U.S. Application Data

(60) Provisional application No. 60/552,963, filed on Mar. 12, 2004.

(51) Int. Cl.
*B05C 17/10* (2006.01)

(52) U.S. Cl. .................... 101/123; 101/127; 101/127.1; 101/129; 118/413

(58) Field of Classification Search ................ 101/123, 101/114, 127.1, 127, 154, 157, 161, 155, 101/156, 164, 165, 166, 167, 168, 169, 160; 118/413, 713
See application file for complete search history.

(56) References Cited

U.S. PATENT DOCUMENTS

| | | | | |
|---|---|---|---|---|
| 1,583,283 A * | 5/1926 | Dunlap | | 118/612 |
| 3,943,849 A * | 3/1976 | Vasilantone | | 101/123 |
| 4,193,345 A * | 3/1980 | Schoneberger et al. | | 101/365 |
| 4,404,903 A * | 9/1983 | Cronin | | 101/123 |
| 4,599,248 A * | 7/1986 | Shirataki | | 427/209 |
| 4,638,733 A * | 1/1987 | Schneider et al. | | 101/114 |
| 4,715,278 A | 12/1987 | Ericsson | | |
| 4,937,097 A * | 6/1990 | Ichinose et al. | | 427/96.9 |
| 5,044,306 A | 9/1991 | Erdmann | | |
| 5,047,262 A * | 9/1991 | deVries et al. | | 427/508 |
| 5,105,551 A * | 4/1992 | McCutchen et al. | | 335/63 |
| 5,346,552 A * | 9/1994 | Zimmer | | 118/126 |
| 5,392,705 A * | 2/1995 | Jaffa | | 101/123 |
| 5,479,854 A * | 1/1996 | Chikahisa et al. | | 101/123 |
| 5,647,907 A | 7/1997 | van der Meulen | | |
| 5,681,387 A | 10/1997 | Schmidt | | |
| 5,709,751 A | 1/1998 | van der Meulen | | |
| 6,092,463 A * | 7/2000 | Onishi et al. | | 101/129 |
| 6,112,656 A | 9/2000 | Asai et al. | | 101/123 |
| 6,112,657 A * | 9/2000 | Bill | | 101/123 |
| 6,131,510 A * | 10/2000 | Gasquez | | 101/123 |
| 6,142,070 A * | 11/2000 | Hoffman et al. | | 101/123 |
| 6,272,984 B1 | 8/2001 | Kato et al. | | |

(Continued)

FOREIGN PATENT DOCUMENTS

DE   3841116 A1 * 9/1989

(Continued)

*Primary Examiner*—Judy Nguyen
*Assistant Examiner*—Matthew G Marini
(74) *Attorney, Agent, or Firm*—Steptoe & Johnson LLP

(57) ABSTRACT

The present invention relates to a segmented squeegee for depositing a medium onto a surface, such as depositing solder paste onto a printed wiring board. The segmented squeegee may include a plurality of independent squeegee segments or elements, a support structure and a plurality of independent connections or linkages connecting the squeegee segments to the support structure. The segmented squeegee may be used in connection with a conventional stencil such that the independent linkages and the squeegee segments may be structured and arranged to maintain substantial contact between the stencil and the printed wiring board.

16 Claims, 5 Drawing Sheets

U.S. PATENT DOCUMENTS

| | | | | |
|---|---|---|---|---|
| 6,352,026 | B1 | 3/2002 | Murakami | 101/127 |
| 6,397,741 | B1 | 6/2002 | Curtin | 101/114 |
| 6,494,132 | B1 * | 12/2002 | Sano et al. | 101/123 |
| 6,494,133 | B2 | 12/2002 | Ooe | |
| 6,612,231 | B2 | 9/2003 | Shimizu et al. | 101/123 |
| 6,663,712 | B2 | 12/2003 | Doyle et al. | 118/301 |
| 2001/0008101 | A1 * | 7/2001 | Ooe | 101/123 |
| 2002/0108513 | A1 * | 8/2002 | Onishi et al. | 101/129 |
| 2002/0166505 | A1 | 11/2002 | Hikami et al. | |
| 2002/0195007 | A1 * | 12/2002 | Sano et al. | 101/123 |
| 2005/0268799 | A1 * | 12/2005 | Pham-Van-Diep et al. | 101/123 |

FOREIGN PATENT DOCUMENTS

JP          08011287 A  *  1/1996

* cited by examiner

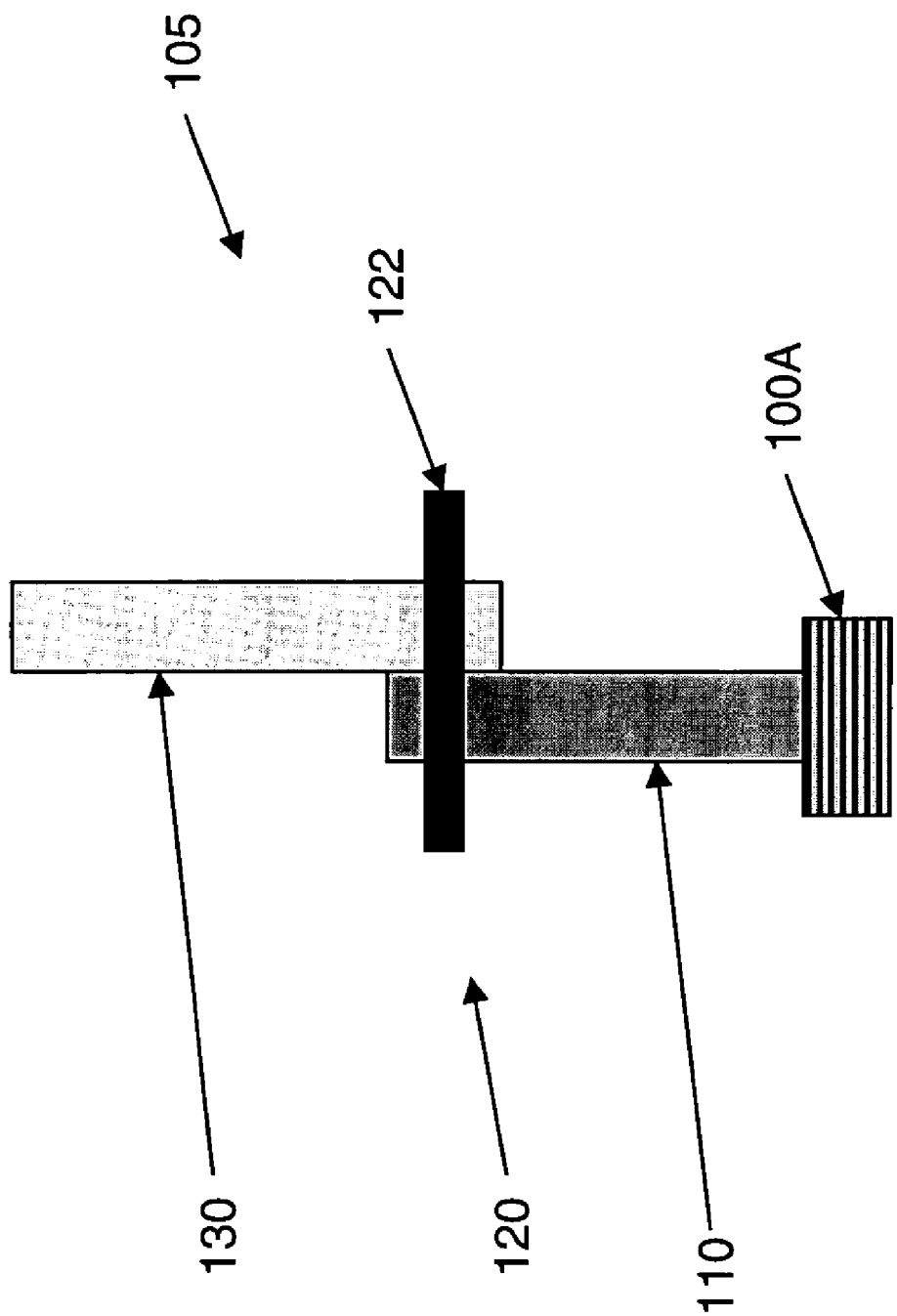

APPARATUS AND METHOD FOR A SEGMENTED SQUEEGEE FOR STENCILING

This application claims priority from U.S. provisional patent application Ser. No. 60/552,963, filed Mar. 12, 2004, entitled "SEGMENTED SQUEEGEE FOR STENCILING" and, the disclosure of which is incorporated herein, in its entirety, by reference.

FIELD OF THE INVENTION

The present invention generally relates to the use of squeegees in the production of printed wiring boards ("PWBs"), and more particularly to an apparatus and method for utilizing a segmented squeegee on PWBs.

BACKGROUND OF THE RELATED ART

The production of PWBs includes a variety of techniques to deposit solder paste on a substrate. One method of depositing solder paste includes stenciling. This method includes the use of a stencil with cutouts in the stencil corresponding to the desired solder pattern for a PWB. The stencil, typically constructed of metal, is applied to the surface of a PWB and solder paste is applied to the stencil. A straight, rigid edge element, commonly referred to as a squeegee, is pressed down on the stencil and is wiped or moved across the stencil to deposit an even, smooth portion of solder paste into the cutouts of the stencil. Once the squeegee and stencil are removed, a solder pattern is left behind on the PWB.

The print quality of the PWB depends on the consistency of the dimensions and thickness of the solder paste after deposition. The dimensions and the patterns of the stencil in the stenciling process typically control the amount and thickness of the deposited solder paste. However, accurate deposition of the solder paste requires the stencil to be flush or in contact with the surface of the PWB as solder paste is deposited. Typically, the stencil is forced into contact with the PWB by the squeegee during the stenciling process.

Unfortunately, the non-coplanarity of PWBs significantly affects the print quality of the stenciling process because contact between the stencil and the PWB cannot be maintained during the stenciling process. As shown in FIG. 1, despite downward pressure from the squeegee, the stencil may not remain in contact with the PWB during stenciling if the warpage or non-coplanarity creates valleys or low lying depressions. As a result, printing quality may be insufficient to meet minimum standards, which results in additional production costs, repetition of work, and increased use and wear on production equipment.

The effect on print quality is particularly problematic for large PWBs. As the size of the PWB grows, the warpage or non-coplanarity typically worsens. This makes stenciling on large sized PWBs difficult with conventional equipment. Unfortunately, most large sized boards contain warpage and non-coplanarity characteristics that are incompatible with the use of conventional equipment, even if the boards meet standard specifications (0.75% max warpage per inch), such as IPC-2221 for surface mount technology.

The conventional equipment available for stenciling solder paste or adhesives on large size PWBs, such as boards greater than 18×24 inches, includes a metal stencil and a long, straight, rigid squeegee. The conventional squeegee is typically greater than 18 inches long and constructed from metal, generally stainless steel.

Stenciling large sized PWBs using a conventional long, straight squeegee results in unacceptable print quality because the squeegee is incapable of conforming to the non-coplanarity of the large sized boards. For example, as solder paste is spread over the stencil, a long, straight, rigid squeegee rides on the peaks of a warped large sized board without adequately pressing into the low lying areas of the board. As a result, conventional squeegees inadequately maintain contact between the stencil and the surface of the PWB. Consequently, deposition of solder paste onto low lying areas of a warped large sized board is inconsistent and insufficient to meet minimum print quality.

In previous attempts to overcome non-coplanarity have included increasing the downward pressure from the squeegee, using a flexible squeegee, and even trying to improve the coplanarity requirements on PWBs. Unfortunately, increased pressure from the squeegee results in damage to the stencil and the underlying PWB during the stenciling process. Further, increased pressure and friction between the stencil and squeegee results in significantly increased wear of and increased replacement of stenciling equipment.

Another attempt includes the use of flexible squeegees, which provide some ability to conform to the contours of the PWB. However, flexible squeegees are significantly less durable and more difficult to clean. While rigid squeegees provide a durable and consistent edge, which is necessary for uniform and accurate solder deposition, flexible squeegees have edges that degrade quickly under repeated use and cleaning.

Finally, attempts to require more consistent and coplanar PWBs are not practical for large sized PWBs. The increased cost of producing PWB with greater copalanarity is prohibitive, especially due to the fact that much of the warpage of the PWB is due to local heating and cooling during subsequent processing of the PWB.

Therefore, there exists a need for a squeegee capable of improving PWB print quality and compensating for the non-coplanar characteristics of large sized boards.

SUMMARY OF THE INVENTION

One embodiment of the present invention generally relates to a squeegee assembly for applying a medium to a surface. The squeegee assembly includes a plurality of squeegee segments and a support structure. The plurality of squeegee segments and the support structure are joined by a plurality of independent linkages.

Another embodiment of the present invention relates to a configuration of the squeegee segments. The squeegee segments are positioned in a staggered and overlapped configuration. The squeegee segments allow excess solder paste to be transferred across the stencil in the squeegee direction and in a substantially perpendicular direction to the squeegee direction.

Another embodiment of the present invention relates to a method of stenciling a medium onto a top surface of a substrate. The method steps include positioning a stencil on the substrate, such that the bottom surface of the stencil is in substantial contact with the top surface of the substrate and applying solder paste to the top surface of the stencil. The method also includes squeegeeing the top surface of the stencil with a plurality of independent squeegee segments in a predetermined direction and maintaining substantial contact, beneath each of the plurality of independent squeegee segments, between the bottom surface of the stencil and the top surface of the substrate.

BRIEF DESCRIPTION OF THE DRAWINGS

While the specification concludes with claims particularly pointing out and distinctly claiming the present invention, it may be believed the same will be better understood from the following description taken in conjunction with the accompanying drawings, which illustrate, in a non-limiting fashion, the best mode presently contemplated for carrying out the present invention, and in which like reference numerals designate like parts throughout the figures, wherein:

FIG. 5 is a detailed side view of a squeegee segment according to one embodiment of the present invention.

DETAILED DESCRIPTION OF THE EMBODIMENTS

For simplicity and illustrative purposes, the principles of the present invention are described by referring mainly to exemplary embodiments thereof. However, one of ordinary skill in the art would readily recognize that the same principles are equally applicable to, and can be implemented in, many types of printing or stenciling processes and that any such variations do not depart from the true spirit and scope of the present invention. Moreover, in the following detailed description, references are made to the accompanying figures, which illustrate specific embodiments. Electrical, mechanical, logical and structural changes may be made to the embodiments without departing from the spirit and scope of the present invention. The following detailed description is, therefore, not to be taken in a limiting sense and the scope of the present invention is defined by the appended claims and their equivalents.

Figure 1:
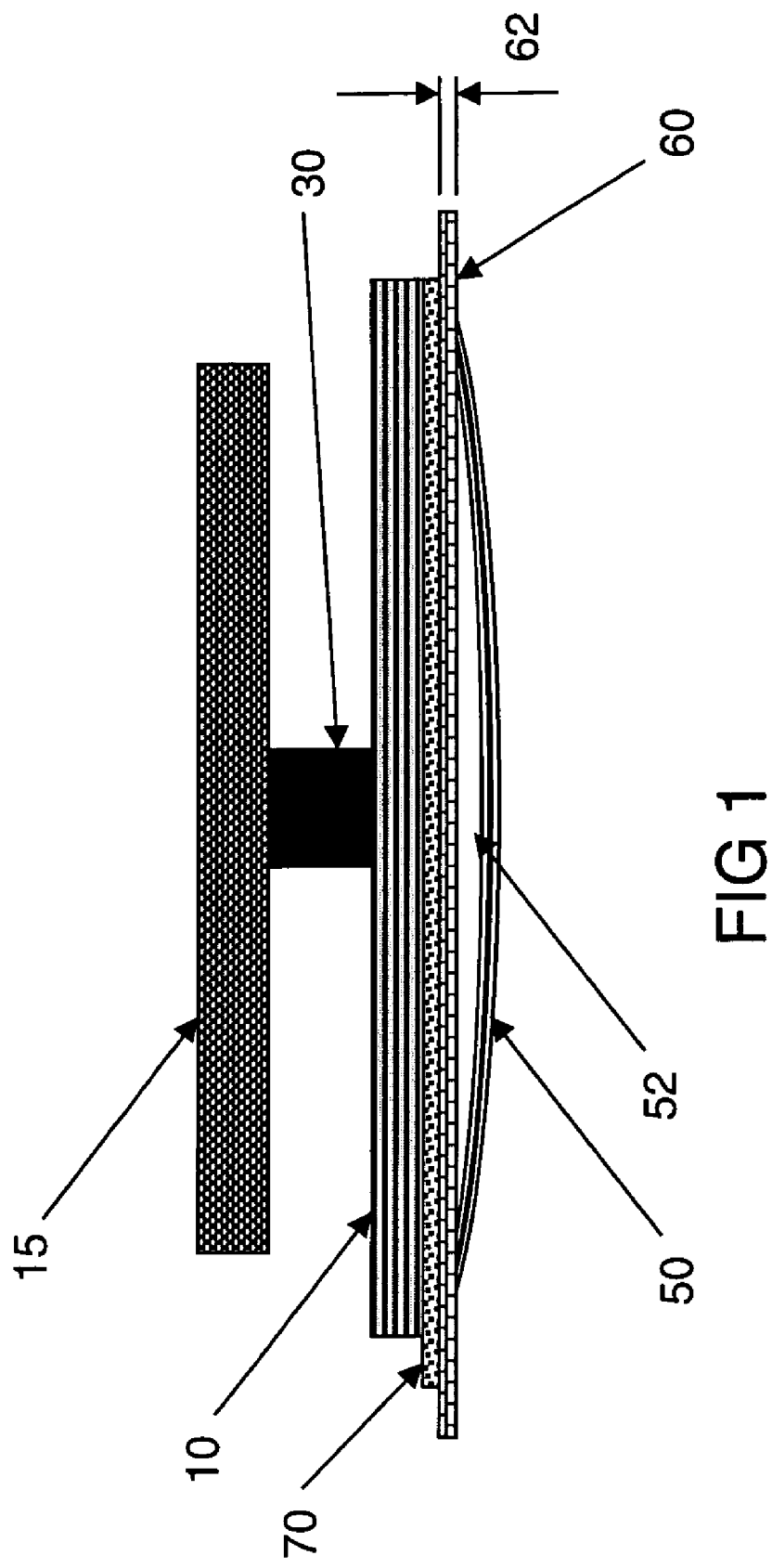
FIG. 1 is a front view of a prior art stencil and squeegee assembly.

In FIG. 1, a prior art embodiment of a conventional stenciling assembly is shown. The conventional stenciling assembly includes a straight, long squeegee 10 held by a support structure 15 and a support link 30. Due to the structural demands and the need to wash and clean the equipment, the support structure 15, support link 30, and long squeegee 10 typically are constructed from a strong rigid material such as steel.

The conventional stenciling assembly shown in FIG. 1 illustrates an example of the disadvantages of the long squeegee 10. As shown, PWBs 50 is warped such that the two sides of the PWB 50 are raised with a low lying valley in the center. Accordingly, a gap 52 between the PWB 50 and the squeegee 10 may be present during deposition of the solder paste 70. The conventional squeegee 10 is incapable of bending or flexing with the PWB 50. As a result, the stencil 60 does not remain in contact with the surface of the PWB 50 during deposition of solder paste 70.

The stencil 60 typically controls the thickness and pattern of solder paste 70 deposited on the PWB 50. As shown in FIG. 1, the center of the PWB 50 and the stencil 60 are not in contact due to the warpage and the gap 52. Accordingly, the amount of solder paste 70 deposited on the center of the PWB 50 may be sporadic or inconsistent with the outer sides of the PWB 50. The inconsistency may range from only slight deposition of solder paste 70 to complete lack of deposition of solder paste 70 in the low lying sections of a warped PWB 50.

Due to the concentration of stresses on the high sections of a warped PWB 50 (shown as the outer sides in FIG. 1), deposition of solder paste on high sections of the PWB 50 may also be too thin or otherwise inconsistent. Even slight inconsistencies in the application of solder paste 70 on a PWB 50 may be unacceptable in certain applications such as high reliability systems for space applications and/or military applications. As a result, the use of conventional stenciling equipment on large PWBs increases production costs through unnecessary repeated use and wear of equipment and low quality control.

It should be understood that the non-coplanarity of the PWB 50 shown in FIG. 1 is only an example. As would be obvious to one of ordinary skill, large sized PWBs may be warped in many different configurations to which the application of the present invention is intended to apply. For example, the PWB may be warped in the opposite direction of that shown in FIG. 1 with two sides that are lower than a high section in the center. Further, a single PWB may include multiple high sections and/or multiple low lying sections.

Figure 2:
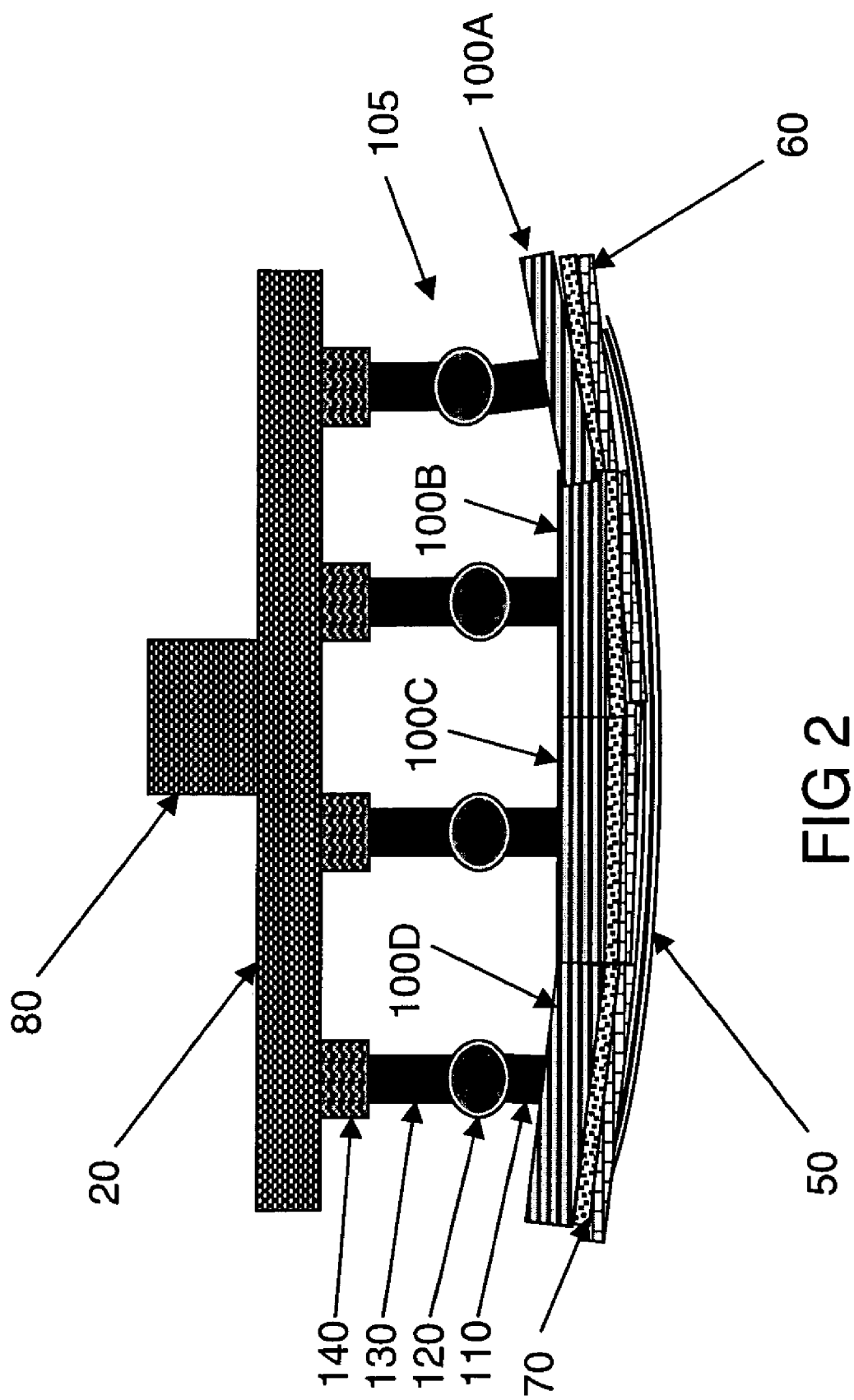
FIG. 2 is a front view of a segmented squeegee and stencil according to one embodiment of the present invention.

Referring now to FIG. 2, a segmented squeegee stenciling system according to one embodiment of the present invention is shown in a front view. As with the conventional system of FIG. 1, a support structure 20 provides the structural foundation for the squeegee during the stenciling process. However, instead of having a single long rigid squeegee 10, the embodiment of the present invention shown in FIG. 2 includes squeegee elements or segments 100A, 100B, 100C, and 100D.

Each of the squeegee segments 100A, 100B, 100C, and 100D are connected to the support structure 20 with a mechanical linkage or connection 105. The linkage 105 includes a lower beam or lower squeegee holder 110, a hinge or flexible joint 120, a upper beam or upper squeegee holder 130, and a biasing member 140. The segmented squeegee assembly connects via a bracket or connector 80 to a transmission or motor for moving the segmented squeegee assembly during the process of stenciling. It should be noted that the linkages 105 are independent and permit independent movement of each of the squeegee segments 100A, 100B, 100C, and 100D.

The squeegee segments 100A, 100B, 100C, and 100D and their independent movement allow for each segment to exert independent forces and individually apply the soldering paste 70. Because each segment is responsible for a smaller section of the stencil 60 and the PWB 50, less force may be required to maintain contact between the stencil 60 and the PWB 50. This may reduce the total amount of force required and reduce the amount of stress applied to the stencil 60 and the PWB 50 during the stenciling process. Further, the reduced total force may decrease the wear on the squeegee and stencil, prolonging the usable life of the components.

The biasing member 140 biases each of the squeegee segments 100A, 100B, 100C, and 100D such that the squeegee segments 100A, 100B, 100C, and 100D conform to the surface of the PWB 50 as shown in FIG. 2. The hinges 120 allow the squeegee segments 100A, 100B, 100C, and 100D to rotate and align the flat surface of the squeegee segments 100A, 100B, 100C, and 100D with the localized surface of the PWB 50 under each squeegee segment. The squeegee segments 100A, 100B, 100C, and 100D, as shown in FIG. 2, are configured to independently maintain contact between the stencil 60 and the PWB 50 despite the curvature of the PWB 50.

The individual squeegee segments 100A, 100B, 100C, and 100D are shorter in length than the conventional squeegee 10, allowing the smaller squeegee segments to press down, between the high sections of the PWB 50, into the low-lying areas. By comparison, the long squeegee 10, as shown in FIG. 1, rests on the outer sides of the PWB 50 without extending down to the gap 52.

FIG. 2 also illustrates how the squeegee segments 100A, 100B, 100C, and 100D impart consistent downward forces on the stencil 60 and the PWB 50 despite whether or not the squeegee segments fall on high sections or low sections of the PWB 50. Because of the independent action of the squeegee segments of the present invention, the stencil 60 maintains contact with the curvature of the PWB 50 during the process of solder paste deposition without forcing the PWB 50 to flex or change shape during stenciling. The biasing member 140 and the hinge 120 may apply a downward force on each of the squeegee segments 100A, 100B, 100C, and 100D to locally press the stencil 60 onto the PWB 50. By maintaining contact between the stencil 60 and any low-lying areas of the PWB 50, the consistency of the deposition of the solder paste 70 may be improved without additional localized stress on the high sections of the PWB.

The support structure 20 is illustrated as a solid plate approximately the same width as the squeegee segments 100A, 100B, 100C, and 100D. However, the support structure 20 may include hollow structures, beams, tubes, or other structures known to one skilled in the art so long as the structure is capable of withstanding the forces exerted through connector 80 and supporting the squeegee segments 100A, 100B, 100C, and 100D. The support structure 20 must also be sufficiently stiff such that the support structure 20 may react against the biasing members 140 during the stenciling process in order to press the stencil 60 into contact with the surface of the PWB 50 and to maintain consistent contact as the support structure 20 moves.

It should be noted that the hinge or joint 120 and the biasing member 140 are configured to provide each of the squeegee segments 100A, 100B, 100C, and 100D with two degrees of freedom of motion. The first degree of freedom includes vertical movement up and down with the biasing member 140 forcing the squeegee segments in a downward direction. The second degree of freedom includes angular movement about the joint or pivot point 120.

The two degrees of freedom of motion enables each of the squeegee segments 100A, 100B, 100C, and 100D to engage to PWB 50 with as little gap between the squeegee segments 100A, 100B, 100C, and 100D and the PWB 50 as possible. For example, in FIG. 2, the squeegee segment 100A engages the PWB 50 at an angle with the right hand side of the squeegee segment 100A engaging the PWB 50 at a higher point that the left hand. The squeegee segment 100A rotates about the joint 120 to achieve the orientation shown.

The biasing member 140 provides the ability to for the squeegee segments 100A, 100B, 100C, and 100D to apply consistent downward forces and to engage the PWB 50 at different elevations as seen in FIG. 2. For example, the squeegee segments 100B and 100C extend further into the low-lying areas in the center of the PWB 50. The squeegee segments 100A, 100B, 100C, and 100D may be capable of about 0.010 inches of vertical travel and about 2 degrees of rotation about the flexible joint 120.

Figure 3:
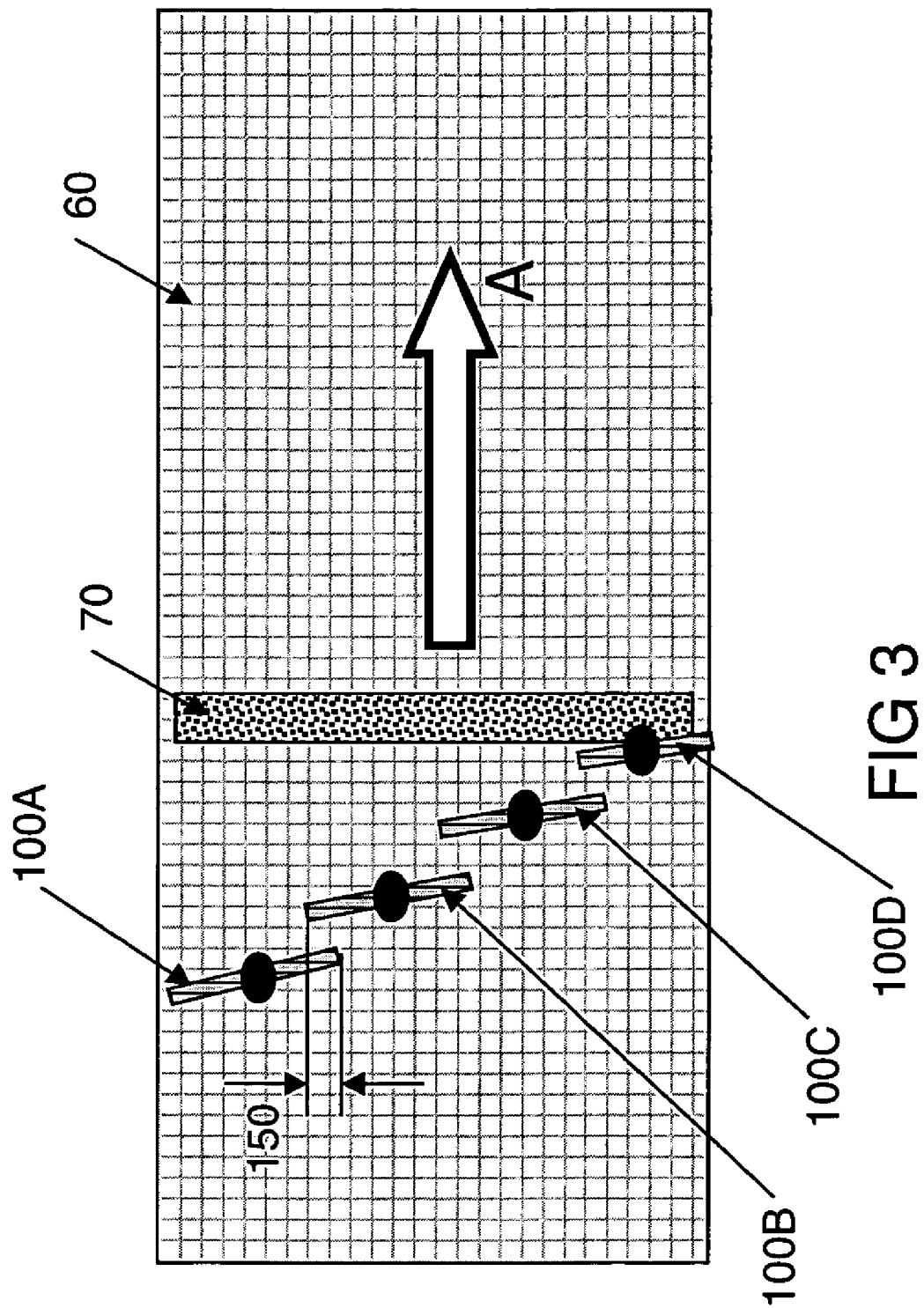
FIG. 3 is a top view of a segmented squeegee and stencil according to one embodiment of the present invention.

Referring now to FIG. 3, the configuration of the squeegee segments 100A, 100B, 100C, and 100D according to an embodiment of the present invention is shown in a top view. The squeegee segments 100A, 100B, 100C, and 100D may be configured into a staggered and overlapped configuration.

The squeegee segments may be moved across the stencil 60 and the PWB 50 in the direction shown as arrow A in FIG. 3. This staggered and overlapped configuration allows excess solder paste to be transferred across the stencil 60 in the direction of arrow A and in a direction perpendicular to arrow A. The staggered and overlapped configuration also allows the squeegee segments 100A, 100B, 100C, and 100D to individually interact with the PWB surface without interference with other segments to remove excess solder paste without leaving streaks or solder clumps.

The staggered and overlapped configuration also improves consistency by continuously removing excess solder paste forward and to the side of the PWB 50 during the stenciling process. While the prior art allows solder paste to clump and build up in front of the single squeegee 10, the staggered and overlapped configuration directs clumps and excess solder paste to the side. This may reduce solder paste clumps and excess accumulation from creating divots or other inconsistencies in the solder paste as the squeegee segments pass over the deposition patterns in the stencil 60.

The staggered and overlapped configuration of the squeegee segments 100A, 100B, 100C, and 100D includes each of the squeegee segments 100A, 100B, 100C, and 100D being angularly disposed from the direction of arrow A. The angle of each squeegee segment 100A, 100B, 100C, and 100D, as shown in FIG. 3, directs (as a function of squeegee speed) excess solder paste 70 toward the top of FIG. 3 as the squeegee assembly travels in the direction of arrow A. It should be noted that, although the squeegee segments are allowed to rotate about hinge 120 as shown in FIG. 2, the angular position of the squeegee segments 100A, 100B, 100C, and 100D as shown in FIG. 3 may be substantially fixed. These angular positions allow the staggered and overlapped configuration to drive excess solder paste to the side of the PWB 50 without allowing clumps to be left behind by the squeegee or to excessively build up on the squeegee during stenciling.

As solder paste 70 is pushed forward and to the side by the angular position of the squeegee segments 100A, 100B, 100C, and 100D, some amount of solder paste 70 falls to the side of each squeegee segment and is left behind. To avoid any solder paste 70 being left behind on the stencil 60, the squeegee segments 100A, 100B, 100C, and 100D are staggered and overlapped. The squeegee segments 100A, 100B, 100C, and 100D are staggered in the direction of arrow A with squeegee segment 100A being position behind squeegee segment 100B. Likewise, squeegee segment 100B is behind squeegee segment 100C, which is behind squeegee segment 100D. Further, the squeegee segments are overlapped as shown by the overlap 150 between squeegee segments 100A and 100B.

The overlap 150 and staggered positioning allows for the staggered and overlapped configuration where each squeegee segment picks up the solder paste 70 left behind by the squeegee segment in front. This staggered and overlapped effect provides a stenciling process that avoids leaving solder paste clumps behind and avoids having excessive build up of solder paste on the squeegee segments 100A, 100B, 100C, and 100D during stenciling. The squeegee segment 100A pushes excess solder paste 70 to the side of the stencil 60 and away from the PWB 50. Then, the excess solder paste 70 may be easily cleaned or removed without affecting the PWB 50 under the stencil 60.

It should be noted that the squeegee segments 100A, 100B, 100C, and 100D provide independent action between the segments such that each segment can maintain contact, through the stencil, with the PWB as the squeegee segments are wiped across the stencil in the direction of arrow A. As opposed to the conventional squeegee 10 and the gap 52, the squeegee segments 100A, 100B, 100C, and 100D may eliminate a substantial amount of gap 52, as shown in FIG. 1, and minimize any gap under the individual segments. By reducing any gaps between the PWB 50 and the stencil 60, the squeegee segments 100A, 100B, 100C, and 100D may reduce the uneven or inconsistent deposition of solder paste 70.

FIG. 3 illustrates one embodiment of the staggered and overlapped configuration according to the present invention. However, the staggered and overlapped configuration of the squeegee segments may be changed or reconfigured without deviating from the true spirit and scope of the present invention. The angular position of the squeegee segments 100A, 100B, 100C, and 100D may be varied or even reversed such that the squeegee segments 100A, 100B, 100C, and 100D work in concert to drive the solder paste 70 forward and to either side or even both sides of the PWB 50.

FIG. 3 also shows the squeegee segment 100D as the most forward squeegee segment in the configuration. However, squeegee segment 100A may be positioned to in the most forward position with the squeegee segments 100B, 100C, and 100D staggered in the opposite direction of that shown in FIG. 3. It is also contemplated that the configuration of the squeegee segments could represent an arrowhead shape where the squeegee segments push solder paste to both sides of the stencil 60.

It is important to note that the configuration of the squeegee segments 100A, 100B, 100C, and 100D as shown in FIGS. 2 and 3 is only representative in nature. The number of the squeegee segments may be more or less depending on the individual size of the squeegee segments, the type of staggered and overlapped configuration, and the overall size of the stencil. Although the squeegee segments are shown having identical shape and size, the squeegee segments may be shaped and sized differently, especially to avoid squeegee segment edges from passing over sensitive components of the PWB 50 and/or cutouts in the stencil 60.

Figure 4:
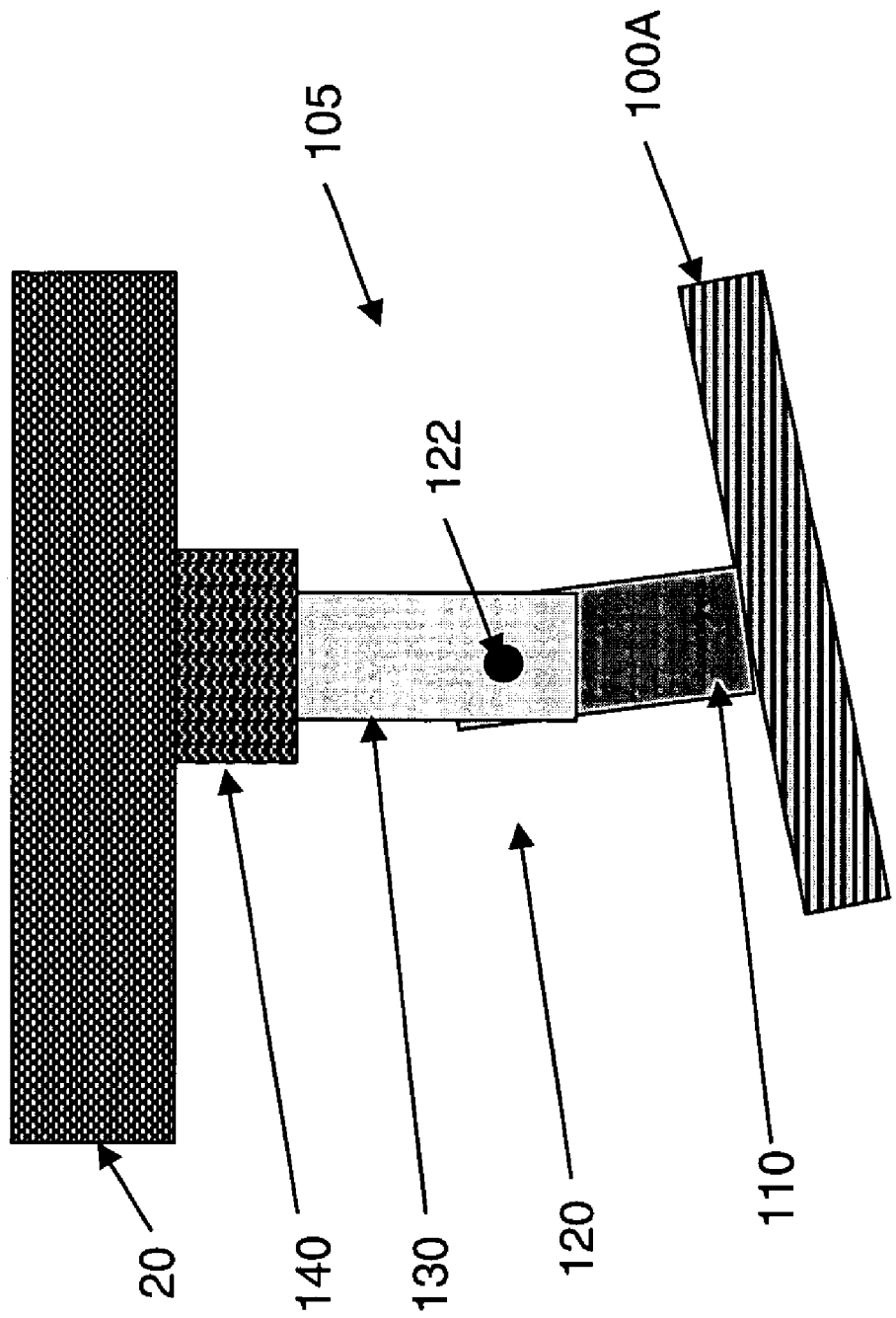
FIG. 4 is a detailed front view of a squeegee segment according to one embodiment of the present invention.

Referring now to FIG. 4, a detail front view of the mechanical linkage 105 is shown. The link 105 connects the squeegee segments 100A, 100B, 100C, and 100D with the support structure 20. The biasing member 140 is fastened to the support structure 20 and to the upper squeegee holder 130. The biasing member 140 biases the upper squeegee holder 130 in a downward direction such that the squeegee segments 100A, 100B, 100C, and 100D may be biased against the stencil 60 and the PWB 50.

FIG. 5 illustrates a cross sectional view of the upper squeegee holder 130, the hinge 120, the lower squeegee holder 110 and the squeegee segment 100A. The pin 122 is shown passing through the upper and lower squeegee holders and creating the hinge 120.

The lower squeegee holder 110 and the upper squeegee holder 130 are joined by a hinge or joint 120. As shown in FIG. 4, the hinge 120 includes an end of the upper squeegee holder 130 and an end of the lower squeegee holder 110 with a hole in each. A pin 122 is placed through the holes in the upper and low squeegee holders 110 and 130 such that the lower squeegee holder 110 and the squeegee segment 100A can rotate about the pin 122.

Although, the hinge 120 is shown in FIGS. 4 and 5 as a standard hinge, the hinge 120 may include many different types of rotating members or joints and be constructed from many different methods known to those skilled in the art. It is also contemplated that in other embodiments the connection between the upper and lower squeegee holders may not have any moving parts but may include flexible material that is designed or constructed to flex in the same direction as the hinge shown in FIG. 4 but to be stiff in other directions. The upper and lower squeegee holders may also be a single element with a flexible or weakened section representing the hinge 120.

In FIGS. 4 and 5, the hinge 120 is shown positioned equally between the biasing member 140 and the squeegee segment 100A. However, the hinge 120 may be positioned at different heights. The hinge 120 may also be mounted directly to the biasing member 140 or the squeegee segment 100A such that one of the upper or lower squeegee holders may no longer be needed.

The biasing member 140 is shown as a common commercially available coil spring and is made up of spring steel. The biasing member 140 accommodates an up-down movement of the holder 130 as the squeegee segments 100A, 100B, 100C, and 100D follow the height of the PWB surface. This up-down movement is typically less than 0.010 inch. An alignment pin (not shown) may be used to prevent the squeegee segments 100A, 100B, 100C, and 100D from rotating about the axis of the upper squeegee holder 130 due to the flexibility of the biasing member 140. As would be obvious to one of ordinary skill, the alignment pin may engage the support structure 20 and the upper squeegee holder 130 as necessary to control any squeegee segment rotation about the axis of the upper squeegee holder 130 and to maintain the squeegee segment orientation as shown in FIG. 3. Although the biasing member is shown as a common coil spring, the biasing means may also be accomplished using other springs and elements as would be obvious to one of ordinary skill. For example, the biasing member 140 may be commercially available hard (shore D 40 to 80) rubber bumpers, or beryllium-copper springs.

Although the embodiment shown in FIGS. 2-5 is directed toward the deposition of solder paste on a PWB, the segmented squeegee assembly described may be used to deposit controlled amounts of other mediums. For example, the present invention may be used to deposit adhesives dots on PWBs or to deposit controlled amounts of fill material in vias, i.e. holes in PWBs.

While the invention has been described with reference to the exemplary embodiments thereof, those skilled in the art will be able to make various modifications to the described embodiments without departing from the true spirit and scope. The terms and descriptions used herein are set forth by way of illustration only and are not meant as limitations. In particular, although the method has been described by examples, the steps of the method may be performed in a different order than illustrated or simultaneously. Those skilled in the art will recognize that these and other variations are possible within the spirit and scope as defined in the following claims and their equivalents.

The invention claimed is:

1. A squeegee assembly for depositing a medium on a deposition surface, the squeegee assembly comprising:
   a plurality of independent moveably mounted squeegee elements, each independent squeegee element arranged to deposit the medium on a portion of the deposition surface;
   a support structure for supporting and coordinating the plurality of independent squeegee elements such that the plurality of independent squeegee elements are configured to deposit the medium to the deposition surface and configured to self-adjust their orientation about their moveable mounting based on a shape of the deposition surface upon which the medium is being applied;
   a plurality of independent connections joining the plurality of independent squeegee elements to the support structure such that each of the plurality of independent connections is configured to maintain substantial contact between a bottom surface of a stencil and the deposition surface, each of the plurality of independent connections including a single central vertical biasing member and a rotating joint; and the plurality of independent connections provides each of the plurality of independent squeegee elements with two degrees of freedom of motion;

the stencil further having a top surface in substantial contact with the plurality of squeegee elements, and the bottom surface being positioned substantially on the deposition surface;

a plane defined by the deposition surface, a predetermined direction and a perpendicular direction to the predetermined direction;

an axis perpendicular to the plane;

wherein the squeegee assembly is wiped across the top surface of the stencil in the predetermined direction and wherein the plurality of squeegee elements are positioned and arranged in a staggered and overlapped configuration;

wherein the staggered and overlapped configuration includes the plurality of squeegee elements, the plurality of squeegee elements being disposed parallel to the axis, with a lower portion being rotated about the axis relative to the perpendicular direction such that the lower portion is angularly disposed from the perpendicular direction to the predetermined direction.

2. The squeegee assembly according to claim 1, further comprising:

said single biasing member biasing the plurality of squeegee elements substantially toward the deposition surface.

3. The squeegee assembly according to claim 2, wherein the rotating joint being structured and arranged to substantially align each squeegee segment with a section of the deposition surface.

4. The squeegee assembly according to claim 1, wherein the staggered and overlapped configuration includes staggering the plurality of squeegee elements in the predetermined direction and in a substantially perpendicular direction to the predetermined direction.

5. The squeegee assembly according to claim 4, wherein the plurality of squeegee elements overlap in the substantially perpendicular direction.

6. The squeegee assembly of claim 1, wherein said two degrees of freedom of motion are vertical motion and angular motion.

7. A stenciling assembly for depositing solder paste to a substrate, the stenciling assembly comprising:

a stencil having a top surface and a bottom surface, the bottom surface being positioned substantially on the substrate;

a plurality of independent squeegee elements, each independent squeegee element arranged to deposit the solder paste on a portion of the substrate;

a support structure for supporting and coordinating the plurality of independent squeegee elements such that the plurality of independent squeegee elements are configured to deposit the solder paste to the substrate; and a plurality of independent connections joining the plurality of independent squeegee elements to the support structure;

wherein the plurality of squeegee elements are positioned and arranged in a staggered and overlapping configuration on the top surface of the stencil; and a plurality of independent connections joining the plurality of squeegee elements to the support structure such that each of the plurality of independent connections is configured to maintain substantial contact between the bottom surface of the stencil and a deposition surface; and the plurality of independent connections provides each of the plurality of independent squeegee elements with two degrees of freedom of motion;

wherein the squeegee elements are configured to self-adjust their position about said independent connections based on a shape of said substrate upon which the solder paste is being applied; and wherein the substrate includes a front, a back, and two sides and the staggered and overlapped configuration includes the plurality of squeegee elements being angularly disposed such that solder paste is directed toward the front and toward at least one of the two sides of the substrate;

a plane defined by the deposition surface, a predetermined direction and a perpendicular direction to the predetermined direction;

an axis perpendicular to the plane;

wherein the squeegee assembly is wiped across the top surface of the stencil in the predetermined direction and wherein the plurality of squeegee elements are positioned and arranged in a staggered and overlapped configuration;

wherein the staggered and overlapped configuration includes the plurality of squeegee elements, the plurality of squeegee elements being disposed parallel to the axis, with a lower portion being rotated about the axis relative to the perpendicular direction such that the lower portion is angularly disposed from the perpendicular direction to the predetermined direction.

8. The stenciling assembly according to claim 7, wherein said biasing member biases its respective squeegee element toward the substrate.

9. The stenciling assembly according to claim 7, wherein said rotating joint being structured and arranged to substantially align each squeegee segment with a section of the substrate.

10. The squeegee assembly of claim 7, wherein said two degrees of freedom of motion are vertical motion and angular motion.

11. A method of stenciling a medium onto a top surface of a substrate, the method comprising:

positioning a stencil on the substrate, the stencil having a top surface and a bottom surface, the bottom surface of the stencil being in substantial contact with the top surface of the substrate;

applying solder paste to the top surface of the stencil;

squeegeeing the top surface of the stencil with a plurality of independent squeegee elements in a predetermined direction; and each independent squeegee element self-adjusting its position via a single central vertical biasing member and a rotating joint along at least two degrees of freedom based on a shape of the substrate to maintain substantial contact, beneath each of the plurality of independent squeegee elements, between the bottom surface of the stencil and the top surface of the substrate;

a plane defined by a deposition surface a predetermined direction and a perpendicular direction to the predetermined direction;

an axis perpendicular to the plane;

wherein the squeegee assembly is wiped across the top surface of the stencil in the predetermined direction and wherein the plurality of squeegee elements are positioned and arranged in a staggered and overlapped configuration;

wherein the staggered and overlapped configuration includes the plurality of squeegee elements, the plurality of squeegee elements being disposed parallel to the axis, with a lower portion being rotated about the axis relative to the perpendicular direction such that the lower portion is angularly disposed from the perpendicular direction to the predetermined direction.

12. The method stenciling according to claim 11, further comprising:

arranging the plurality of independent squeegee elements into a staggered and overlapped configuration; and directing the solder paste in the predetermined direction and in at least one direction that is substantially perpendicular to the predetermined direction.

13. The method of stenciling according to claim 11, further comprising:

biasing each of the independent squeegee elements substantially toward the top surface of the substrate.

14. The method of stenciling according to claim 13, further comprising:

aligning each of the independent squeegee elements such that each independent squeegee segment is substantially aligned with a section of the top surface of the substrate directly beneath the independent squeegee segment.

15. The method of claim 11, wherein said two degree of freedom of motion are vertical motion and angular motion.

16. A squeegee assembly for depositing a medium on a deposition surface, the squeegee assembly comprising:

a plurality of independent moveably mounted squeegee elements, each independent squeegee element arranged to deposit the medium on a portion of the deposition surface;

a support structure for supporting and coordinating the plurality of independent squeegee elements such that the plurality of independent squeegee elements are configured to deposit the medium to the deposition surface and configured to self-adjust their orientation about their moveable mounting based on the shape of the deposition surface upon which the medium is being applied;

the plurality of squeegee elements being positioned and arranged in a staggered, parallel and overlapped configuration in which each of said squeegee elements is disposed at an angle transverse to an perpendicular operating path of the squeegee elements;

a plurality of independent connections joining the plurality of squeegee elements to the support structure such that each of the plurality of independent connections is configured to maintain substantial contact between the bottom surface of the stencil and the deposition surface, and the plurality of independent connections provides each of the plurality of squeegee elements with two degrees of freedom of motion;

a plane defined by the deposition surface, a predetermined direction and a perpendicular direction to the predetermined direction;

an axis perpendicular to the plane;

wherein the squeegee assembly is wiped across the top surface of the stencil in the predetermined direction and wherein the plurality of squeegee elements are positioned and arranged in a staggered and overlapped configuration;

wherein the staggered and overlapped configuration includes the plurality of squeegee elements, the plurality of squeegee elements being disposed parallel to the axis, with a lower portion being rotated about the axis relative to the perpendicular direction such that the lower portion is angularly disposed from the perpendicular direction to the predetermined direction.

* * * * *